Oct. 23, 1951 J. E. WOLFE 2,572,232
HIGH-FREQUENCY WAVEMETER
Filed July 10, 1947
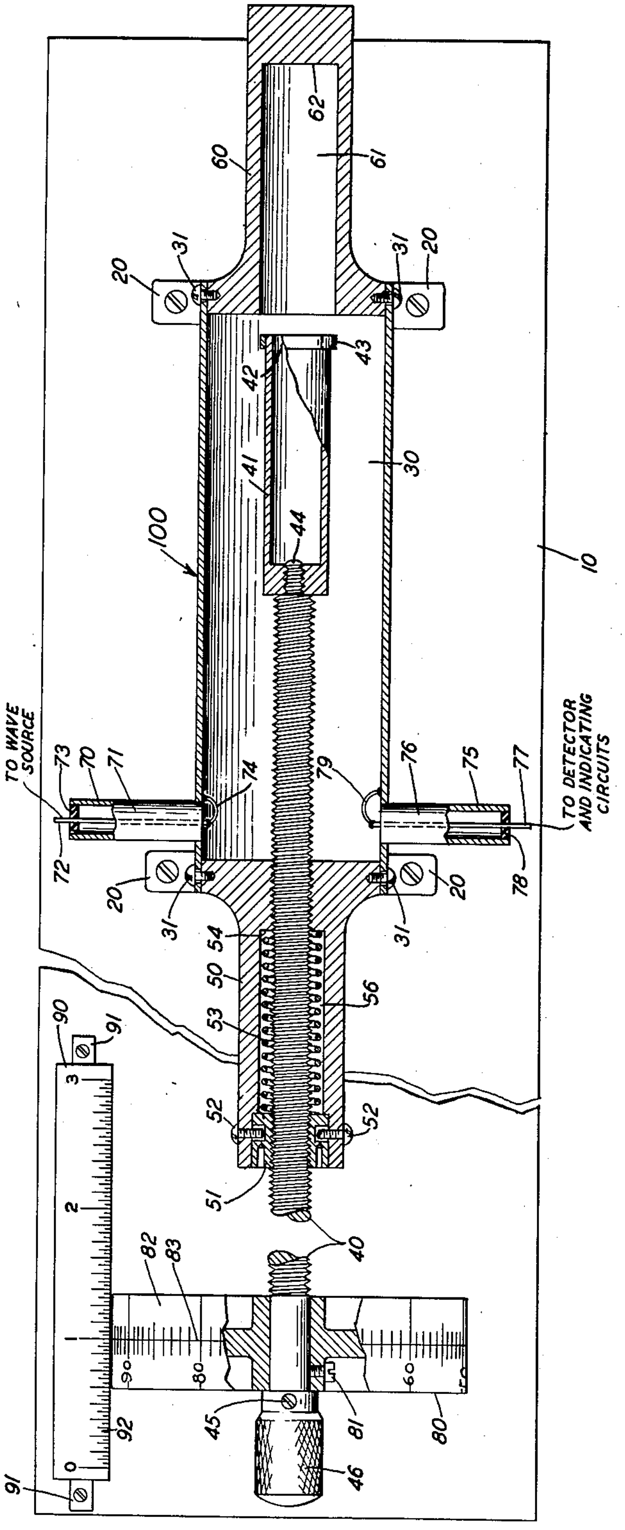
INVENTOR
J. E. WOLFE
BY I. MacDonald
ATTORNEY Patented Oct. 23, 1951

2,572,232

UNITED STATES PATENT OFFICE 2,572,232

HIGH-FREQUENCY WAVEMETER

John E. Wolfe, Manhattan, Kans., assignor to Bell Telephone Laboratories, Incorporated, New York, N. Y., a corporation of New York Application July 10, 1947, Serial No. 760,020

3 Claims. (Cl. 250—39)

This invention relates to the art of signaling with ultra-high frequency electromagnetic waves and more particularly to wavemeters for determining the frequencies of such waves.

In ultra-high frequency wavemeters, it is desirable to have as high a frequency range as possible consistent with precision and small size.

An object of this invention therefore is to provide a relatively small wavemeter of simple construction which will permit rapid and precise determination of the frequency of an ultra-high frequency wave which may be any one of the frequencies falling within a broad band of such frequencies.

The components of the preferred form of this invention described in detail hereinafter include a resonator comprising a calibrated, adjustable, tuned circuit, means for loosely coupling this circuit to the source of the ultra-high frequency wave of which the frequency is to be determined, and means for loosely coupling the tuned circuit to an external detector and indicating circuit associated therewith, the adjustable tuning means including a micrometric precision arrangement, with the tuned circuit comprising inductance and capacitance, the inductance being variable toward one end of the range of the resonator, and the inductance constant and the capacitance variable toward the other end of its range.

A feature is that the wavemeter acts as a resonator of quarter wave resonant coaxial line of variable length toward one end of its range and as a resonator of constant inductance and variable capacitance toward the other end of its range.

Another feature is the micrometric type of adjustment of the inner conductor of the wavemeter and its cylindrical type capacitance which makes possible more precise tuning adjustment than has been possible heretofore.

Still another feature is the cylindrical type capacitance at one end of the travel of the inner conductor of the resonator tuning circuit which results in a very much greater frequency range than previously available. The range may be in the order of ten to one, for example, 1,500 megacycles to 150 megacycles, whereas wavemeters previously available have ranges in the order of about four to one, for example, 1,200 megacycles to 300 megacycles.

Heretofore, wavemeters of the resonator type which use adjustable capacitance in their tuning circuit have been of such design that the larger part of the tuning range is spanned by a very small movement of the movable member as their adjustable capacitance members are brought closer together to increase the capacitance as the range limit is approached. This results in a non-linear calibration curve and loss of accuracy as the range limit is approached. This objection is overcome in the invention disclosed herein because the cylindrical type capacitance provided spreads the capacitance linearly over a considerable movement of the center conductor of the tuning circuit which results in making the tuning less critical, readings more accurate, a larger amount of capacitance available and a consequent increase in the frequency range at the low frequency end of its range.

The nature of the invention together with other objects and features thereof will appear more fully in the following description of a specific embodiment, references being made to the accompanying drawing in which:

The single figure of the drawing shows mainly in section the wavemeter in accordance with this invention.

The wavemeter 100 is mounted on a base 10 by suitable brackets 20 which are attached to a tubular outer conductor 30. The tuning circuit comprises outer cylindrical conductor or member 30, inner cylindrical conductor or member 40 and two end members 50, 60, which are attached to outer conductor 30 by screws 31. The means for loosely coupling the tuning circuit to the source of the waves to be measured comprises a coaxial line 70 which has its outer conductor 71 terminating flush with the inner surface of outer conductor 30, being inserted in a hole in the latter, and inner conductor 72 which enters the coaxial line 70 through insulating bushing 73 and which terminates in a loop 74, the end of which is connected to the inner surface of outer conductor 30, for example, by soldering it thereto. The means for loosely coupling the tuned circuit to a detector and indicating device comprises a coaxial line 75, which is a replica of coaxial line 70 and which has its outer conductor 76 terminating flush with the inner surface of outer conductor 30, being inserted in a hole in the latter, and in which inner conductor 77 enters through insulating bushing 78 and which terminates in a loop 79, the end of which is connected to outer conductor 30. Coaxial line 70 is placed diametrically opposite coaxial line 75 in outer conductor 30 and both are located in outer conductor 30 near the end member 50.

The inner conductor 40 is threaded throughout its length with 32 threads per inch. It threadedly engages the end member 50 which has a threaded bushing 51 fitted in its outer end which threadedly engages the conductor 40. The bushing 51 is held against rotation upon the rotation of conductor 40 by two diametrically opposite screws 52, these screws being in turn fitted in radially disposed slots in the sleeve 50 so as to permit the spring 56 to exert pressure on the bushing to cause a predetermined amount of friction on the thread of conductor 40 so as to hold it and the drum 80 secured thereto in each adjusted position.

The inner end of conductor 40 has a metallic cylinder 41 attached to it, for example by threads 44. The projecting end 42 of cylinder 41 has a ring or spacer 43 of insulating material, for example, polystyrene, cemented to it around its exterior. End member 60 has a cylindrical cavity 61 which has an inner diameter such that the end ring 43 of cylinder 41 can enter it and it is positioned so that by turning conductor 40 the cylinder 41 will progress toward the end 62 of cylindrical cavity 61, with substantially uniform clearance throughout its travel. Spacer 43 serves to keep cylinder 41 accurately spaced when in cavity 61. The outer end of conductor 40 may have a thumb nut 46 rigidly attached to it by set screw 45.

A rotor scale or micrometer wheel 80 is rigidly attached to conductor 40 by a set screw 81. The wheel 80 is marked on its outer cylindrical surface 82 with 100 equal divisions suitably engraved thereon parallel to its axis and with numerical indicator markings also engraved thereon at every tenth division, for example, 10, 20, 30, etc. It has a circular mark 83 engraved around its circumference. Scale 90 is mounted by brackets 91 with its face in the same horizontal plane as the axis of conductor 40 and with its engraved edge 92 parallel to the axis of conductor 40 and adjacent to the outer circumference of rotor scale wheel 80, so that when conductor 40 is rotated by means of thumb nut 46, mark 83 will move along the engraved edge of the scale 90. The edge 92 is engraved in inches divided into thirty seconds of an inch. The 32 threads per inch on conductor 40 permit wheel 80 to make one revolution for each thirty-second of an inch of longitudinal movement of conductor 40. Wheel 80 having 100 divisions on its outer cylindrical surface permits accurate movement of conductor 40 by amounts as small as one one-hundredth of one thirty-second of an inch or less.

In the operation of the wavemeter, considering the capacitance member 41 to extend initially to the end of the cavity 61 in the end member 60, the capacity of the circuit is a maximum and therefore the resonant frequency is at its minimum. Turning the thumb nut 46 withdraws the cylindrical capacity member 41 from the cavity thereby decreasing the capacitance of the circuit. The capacitance is between the surface of the cylinder 41 and the side surfaces of cavity 61 so that it is the area common to the two that controls the capacitance of the tuned circuit. While the capacitor member 41 is in the cavity 60, the inductance of the tuned circuit is constant. The frequency is raised in this manner up to the point where the end 42 of the cylindrical member 41 has just left the cavity 61. A continuous increase of frequency is provided following this instance by another effect which takes over at that point. After the member leaves the cavity 61 there is substantially no capacitance effect between the end 42 and the end member 60. However, the inductance of the tuned circuit is then decreased by further withdrawing the rod thereby further increasing the resonant frequency of the wavemeter. This may be considered more easily not in terms of inductance but by considering the resonator as a quarter wave resonant coaxial line. At the moment the end 41 is in line with the surface of the end member 60, the distance between the two end members 50 and 60 is a one-quarter wave for the resonant coaxial line formed by the outer cylinder 100 and the inner conductor 40. By withdrawing the rod or conductor 40, the coaxial line decreases in size, the distance measuring the quarter wavelength being from the face of the end member 50 to the end 42 of the cylindrical member 41. As this distance decreases the resonant wavelength decreases, thereby increasing the frequency of the resonant circuit. It, therefore, is apparent that starting at point 3 on the calibrated scale, at which point the resonant frequency is a minimum, and slowly progressing to point zero, at which point the resonant frequency is a maximum, a wide range of frequencies is provided in which the variations are substantially linear because of, first, the change in capacitance of the circuit and, second, the change in the wavelength of the coaxial line.

The embodiment of the invention described may be used in conjunction with any of the well-known detector and indicating circuits which can be electrically connected to conductor 77. These circuits may include an amplifier. The wavemeter of the invention is calibrated by connecting several known ultra-high frequency wave sources in succession to conductor 72 and adjusting the position of conductor 40 for each frequency by means of thumb nut 44 until the associated detector circuit indicates resonance within the wavemeter (resonator), then reading the location of mark 83 on scale 90, and plotting a curve on coordinate paper with frequency as ordinates and inches as abscissae.

Although the preferred form of the invention as shown is provided with cylindrical condenser members, another form of the invention may be provided with a conical condenser member on the inner conductor and with a conical cavity in end member 60 into which the conical condenser member can enter.

While the features of this invention have been disclosed with reference to a specific embodiment only, it, of course, is understood that various modifications may be made in the details of construction without departing from the scope of this invention as defined in the appended claims.

What is claimed is:

1. A wavemeter comprising a calibrated adjustable sharply tuned resonant circuit, said circuit including a hollow cylindrical member, rod means extending into said cylindrical member at its one end defining a quarter wave resonant coaxial line of variable length therewith to vary the resonance of said circuit at the upper range of frequencies of said wavemeter, capacitance means associated with said rod means and the other end of said cylindrical member defining an end loading capacitance to vary the resonance of said circuit at the lower range of frequencies of said wavemeter, means for loosely coupling a source of electromagnet energy to said tuned circuit, means for loosely coupling said tuned circuit to an external detector and means external to said circuit for reciprocating said rod means.

2. A wavemeter comprising a calibrated adjustable sharply tuned resonant circuit, said circuit including a hollow cylindrical member, a first end member closing one end of said cylindrical member and supporting a first capacitance member, a second end member closing the other end of said hollow cylindrical member and having an aperture therethrough, a rod extending through said aperture, a second capacitance member mounted at the end of said rod, said capacitance members having complementary forms, means for loosely coupling a source of magnetic energy to said tuned circuit, means for loosely coupling said tuned circuit to an external detector and micrometer means external to said circuit for reciprocating said rod with said capacitance members in juxtaposition to vary the capacitance of said circuit or with said capacitance members not in juxtaposition to vary the length of the resonance circuit to vary the resonant frequency substantially linearly over the range of the wavemeter.

3. A wavemeter comprising a calibrated adjustable sharply tuned resonant circuit, said circuit including a hollow cylindrical member, a first end member closing one end of said cylindrical member and having a cavity therein communicating with said hollow cylindrical member, a second end member closing the other end of said hollow cylindrical member and having an aperture therethrough, a rod extending through said aperture, a capacitance member mounted at the end of said rod, said capacitance member having the general form of the cavity within said first end member and fitting therein but electrically separate therefrom, means for loosely coupling a source of electromagnetic energy to said tuned circuit, means for loosely coupling said tuned circuit to an external detector, micrometric means external to said circuit for reciprocating said rod with said capacitance member in said hollow cylindrical member external to said cavity to vary the inductance of said circuit or with said capacitance member in said cavity to vary the capacitance of said circuit, and calibrated means associated with the other end of said rod to determine the position of said capacitance member.

JOHN E. WOLFE.

REFERENCES CITED

The following references are of record in the file of this patent:

UNITED STATES PATENTS

| Number | Name | Date |
|---|---|---|
| 2,218,923 | Newhouse | Oct. 22, 1940 |
| 2,349,340 | Lavoie | May 23, 1944 |
| 2,414,280 | Thomas | Jan. 14, 1947 |
| 2,417,542 | Carter | Mar. 18, 1947 |
| 2,444,041 | Harrison | June 29, 1948 |